US008183139B2

(12) United States Patent
Marxsen et al.

(10) Patent No.: US 8,183,139 B2
(45) Date of Patent: May 22, 2012

(54) REDUCED DEFECTIVITY IN CONTACTS OF A SEMICONDUCTOR DEVICE COMPRISING REPLACEMENT GATE ELECTRODE STRUCTURES BY USING AN INTERMEDIATE CAP LAYER

(75) Inventors: Gerd Marxsen, Radebeul (DE); Jens Heinrich, Wachau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/963,908

(22) Filed: Dec. 9, 2010

(65) Prior Publication Data
US 2011/0269303 A1   Nov. 3, 2011

(30) Foreign Application Priority Data
Apr. 30, 2010   (DE) .......... 10 2010 028 460

(51) Int. Cl.
*H01L 21/28* (2006.01)
(52) U.S. Cl. ............... 438/586; 257/E21.19
(58) Field of Classification Search .......... 438/586; 257/E21.19
See application file for complete search history.

(56) References Cited

U.S. PATENT DOCUMENTS

| | | | |
|---|---|---|---|
| 6,228,760 B1 | 5/2001 | Yu et al. | 438/636 |
| 6,365,464 B1 * | 4/2002 | Chiang et al. | 438/279 |
| 6,867,128 B2 * | 3/2005 | Deleonibus | 438/635 |
| 6,887,747 B2 | 5/2005 | Yagishita et al. | 438/197 |
| 2002/0158340 A1 | 10/2002 | Maltabes et al. | 257/774 |
| 2005/0145894 A1 | 7/2005 | Chau et al. | 257/288 |
| 2009/0023261 A1 * | 1/2009 | Hirano | 438/270 |
| 2010/0052075 A1 * | 3/2010 | Yeh et al. | 257/410 |
| 2010/0224936 A1 * | 9/2010 | Hokazono | 257/368 |
| 2010/0270627 A1 * | 10/2010 | Chang et al. | 257/411 |
| 2011/0108930 A1 * | 5/2011 | Cheng et al. | 257/412 |

FOREIGN PATENT DOCUMENTS

| | | |
|---|---|---|
| DE | 198 26 031 C2 | 6/1998 |
| EP | 1 211 716 A2 | 6/2002 |

OTHER PUBLICATIONS

Translation of Official Communication from German Patent Office for German Patent Application No. 10 2010 028 460.2-33 dated Nov. 15, 2010.

* cited by examiner

*Primary Examiner* — William D Coleman
*Assistant Examiner* — Christine Enad
(74) *Attorney, Agent, or Firm* — Williams, Morgan & Amerson

(57) ABSTRACT

Superior contact elements may be formed in semiconductor devices in which sophisticated replacement gate approaches may be applied. To this end, a dielectric cap layer is provided prior to patterning the interlayer dielectric material so that any previously created cracks may be reliably sealed prior to the deposition of the contact material, while the removal of any excess portion thereof may be performed without an undue interaction with the electrode metal of the gate electrode structures. Consequently, a significantly reduced defect rate may be achieved.

20 Claims, 7 Drawing Sheets

REDUCED DEFECTIVITY IN CONTACTS OF A SEMICONDUCTOR DEVICE COMPRISING REPLACEMENT GATE ELECTRODE STRUCTURES BY USING AN INTERMEDIATE CAP LAYER

BACKGROUND OF THE INVENTION

1. Field of the Invention

The present disclosure generally relates to the field of fabricating integrated circuits, and, more particularly, to complex integrated circuits that comprise metal gate electrode structures formed according to a replacement gate approach.

2. Description of the Related Art

In modern integrated circuits, a very high number of individual circuit elements, such as field effect transistors, resistors, capacitors and the like, are formed on a single chip area. Typically, feature sizes of these circuit elements are steadily decreased with the introduction of every new circuit generation, to provide currently available integrated circuits with a high performance in terms of speed and/or power consumption. A reduction of the size of transistors is an important aspect in steadily improving device performance of complex integrated circuits, such as CPUs. The reduction in size commonly brings about an increased switching speed, thereby enhancing signal processing performance.

With the increasing shrinkage of the features sizes of semiconductor-based circuit elements such as transistors, thereby significantly increasing the overall complexity of the manufacturing processes, also the complexity of a wiring system that establishes the electrical connection of the semiconductor-based circuit elements and of any other circuit elements has to be adapted to the increasing number of circuit elements and the significantly increased packing density. Consequently, typically, in complex integrated circuits, a plurality of stacked wiring layers or metallization layers are required, in which metal lines and vias commonly establish the electrical connections as required by the circuit layout of the device under consideration. Due to the overall reduced feature sizes, the dimensions of metal lines and vias have also been continuously reduced, thereby requiring new strategies and materials for the complex metallization systems.

For this reason, copper in combination with so-called low-k dielectric materials are typically used in complex metallization systems, which, however, may be associated with significant problems in view of the handling of copper in a semiconductor facility. It is well known that copper readily diffuses in a plurality of materials, such as silicon dioxide, silicon dioxide-based low-k dielectric materials and the like. Copper, when diffusing into sensitive device areas such as complex transistor elements, however, may significantly alter the transistor characteristics and may thus finally result in yield loss and reduced reliability of complex semiconductor devices. Therefore, complex manufacturing strategies have been developed in forming complex metallization systems in which the copper material may typically be provided in combination with appropriate conductive and dielectric barrier materials in order to ensure an appropriate copper confinement. Although generally copper may provide superior electrical performance and improved electromigration behavior compared to a plurality of other materials, such as aluminum and the like, other conductive materials and metals may typically be used so as to connect directly to the semiconductor-based circuit elements in order to avoid the risk of copper diffusion into these semiconductor devices. Moreover, the semiconductor-based circuit elements, such as transistors and the like, may typically require a certain degree of passivation, i.e., a certain mechanical and chemical resistivity, and thus the transistor structures are typically embedded in an appropriate dielectric material which may comprise two or more different material layers, depending on the overall device requirements. The dielectric material for passivating the semiconductor-based circuit elements, which will also be referred to herein as an interlayer dielectric material, may thus represent an appropriate interface between the actual semiconductor-based circuit elements and the complex metallization system, which is frequently comprised of copper and sophisticated low-k dielectric materials. In order to appropriately connect the circuit elements to the metallization system, appropriate contact elements have to be provided in the interlayer dielectric material so as to provide, in some cases, a direct connection between several circuit elements and also provide a connection of contact areas of the circuit elements with metal lines or generally metal regions in the very first metallization layer of the metallization system. The combination of the passivating dielectric material and the contact elements formed therein may also be referred to as a contact structure or contact level of the semiconductor device. Consequently, upon reducing the dimensions of the circuit elements in the device level, a corresponding adaptation of the critical dimensions of the contact elements is required, thereby resulting in very complex patterning regimes for forming the contact elements in the interlayer dielectric material. That is, in densely packed device areas, the critical dimensions of the contact elements may be of the same order of magnitude as the critical dimensions of the circuit elements, thereby also requiring comparable critical dimensions in the very first metallization layer in order to not unduly consume valuable chip area. The contact elements are typically formed by first patterning the interlayer dielectric material using sophisticated lithography and etch techniques and subsequently filling the contact openings with an appropriate conductive material, such as tungsten and the like, possibly in combination with conductive barrier materials, if required. Hence, depending on the thickness of the interlayer dielectric material, the contact openings have to be formed on the basis of very critical process conditions since openings with a lateral dimension of 50 nm and less may have to be formed through an interlayer dielectric material of 150 nm and more, depending on the overall device architecture. After providing the contact openings with the desired critical dimensions, a further critical process step is required, i.e., the deposition of an appropriate conductive material, which is to reliably fill the contact openings without undue irregularities, such as voids within the contact openings and the like, in order to obtain a low contact resistivity. In this respect, it should be appreciated that, in sophisticated applications, the overall signal processing capability may significantly depend on the overall resistance in the device level and in the contact level, wherein, in extremely scaled semiconductor devices, the contact resistivity may be the dominant factor that determines the final electrical performance. After the deposition of the contact material, any excess portion thereof has to be removed, which is typically accomplished on the basis of chemical mechanical polishing (CMP) techniques in which appropriate process parameters, such as downforce, relative speed of the polishing pad and the substrate and, in particular, the chemistry of the slurry material, is appropriately selected so as to efficiently remove the excess material without unduly causing damage in other device areas, such as the dielectric material of the contact level and the like. During the removal process, the conductive material is removed from dielectric surface areas in order to provide electrically insulated contact elements, thereby requiring a certain degree of over-polishing time, which may depend on the overall process uniformity. That is, the over-polish time has to be selected such that the excess material is reliably removed in any device areas, such as densely packed device areas or device areas of reduced packing density. In this phase of the removal process, it is important to avoid undue material removal of the dielectric material, which may be accomplished by using a highly selective slurry material, which may thus provide a chemical reaction with the conductive material without unduly affecting the dielectric material.

The continuous shrinkage of critical dimensions of transistor elements has resulted in a minimum gate length of field effect transistors of 40 nm and less. As is well known, transistors of very short channel length may require additional measures for preserving the controllability of the channel region, which has typically been addressed by reducing the thickness of a gate dielectric material, which separates the gate electrode structure of the field effect transistor from the underlying channel region. Thus, by reducing the thickness of the gate dielectric material, the capacitive coupling between the electrode and the channel region may be increased, thereby enabling, in combination with very complex dopant profiles for the drain and source regions, a proper control of the conductive channel, which forms in the channel region upon application of an appropriate control voltage to the gate electrode. Due to the many advantages in using silicon dioxide as a base material for gate insulation layers formed on a silicon-based channel region, silicon dioxide-based dielectric materials have widely been used as a gate dielectric material. For a thickness of approximately 1.5 nm and below, however, the corresponding gate leakage currents in sophisticated transistors may reach values that are no longer acceptable for many types of complex semiconductor devices. For this reason, new strategies have been developed in which the drain and source regions may be provided in a self-aligned manner, as is the case in well-established polysilicon/silicon dioxide gate electrode structures, while nevertheless increasing the effective thickness of the gate dielectric material while providing an oxide equivalent thickness of 1.5 nm and less. To this end, so-called high-k dielectric materials, i.e., dielectric materials having a dielectric constant of 10.0 and higher, may be incorporated into the gate insulation layer of sophisticated transistors, thereby reducing the leakage currents while nevertheless providing the desired capacitive coupling. Moreover, performance of the gate electrode structures may further be enhanced by replacing the polysilicon material by a metal of superior conductivity, thereby generally reducing the gate resistivity and also avoiding the creation of a depletion zone in the vicinity of the gate dielectric material, as is typically observed in polysilicon-based gate electrode structures.

Providing a high-k dielectric material in combination with a metal-containing electrode material in an early manufacturing stage may result in significant difficulties, for instance for adjusting an appropriate work function and preserving its value throughout the entire process flow. Therefore, in very promising approaches, i.e., so-called replacement gate approaches, the gate electrode structures may be formed with a high degree of compatibility with conventional polysilicon gate electrodes, and the highly conductive electrode metal, possibly in combination with any work function adjusting species and possibly together with a high-k dielectric material, may be provided in a very late manufacturing stage, i.e., after completing the basic transistor structure and laterally embedding the gate electrode structure in the interlayer dielectric material. In this manufacturing stage, an opening or trench may be formed in the gate electrode structure by removing the polysilicon material and any appropriate material system may be filled into the gate opening. For example, highly conductive electrode metals, such as aluminum, may frequently be used in order to obtain a desired low resistivity of the high-k metal gate electrode structures. Thus, at a final stage of this replacement gate approach, the electrode metal has to be deposited and subsequently any excess portion thereof needs to be removed, which may typically be accomplished on the basis of a CMP process. It turns out, however, that in particular the final phase of the replacement gate approach may result in significant defectivity and even device failures upon forming contact elements, as will be explained in more detail with reference to FIGS. 1a-1f.

FIG. 1a schematically illustrates a cross-sectional view of the semiconductor device 100 in an advanced manufacturing stage. As illustrated, the device 100 comprises a substrate 101 and a semiconductor layer 102, such as a silicon-based semiconductor material and the like. The semiconductor layer 102 and the substrate 101 may represent a silicon-on-insulator (SOI) architecture when a buried insulating material (not shown) is formed below the semi-conductor layer 102. In other cases, the semiconductor layer 102 may represent, at least in an initial manufacturing stage, a portion of a crystalline material of the substrate 101, thereby forming a bulk configuration. A plurality of transistors 150A, 150B are formed in and above the semiconductor layer 102, wherein, in the example shown, a planar transistor architecture may be used. In this case, the transistors 150A, 150B comprise drain and source regions 153 within the semiconductor layer 102 and laterally enclose a channel region 152, in which a conductive channel forms upon applying an appropriate control voltage to a gate electrode structure 130, as is previously explained. The drain and source regions 153 may comprise appropriate contact areas, in the example shown as metal silicide regions 154. In other cases, the contact areas 154 may be highly doped semiconductor regions, which may receive a metal silicide in a later manufacturing stage, for instance after completing the gate electrode structures 130, if any additional high temperature processes are required which are not compatible with the thermal stability of a desired metal silicide material.

The gate electrode structures 130 may initially be provided on the basis of a polysilicon material, which may be patterned on the basis of design requirements in order to adjust a desired critical dimension of the gate electrode structure 130, which may be 40 nm and less in sophisticated applications. In the manufacturing stage shown, the gate electrode structures 130 may be laterally enclosed by a sidewall spacer structure 151 having any appropriate configuration, in combination with a dielectric material 120, which may also be referred to as an interlayer dielectric material and which may comprise two or more individual material layers, such as layers 121, 122, depending on the overall process and device requirements. For example, the layer 121 may represent a silicon nitride-based material, while the layer 122 may comprise silicon dioxide, which is frequently used as a material for embedding semiconductor-based circuit elements of sophisticated semiconductor devices. The gate electrode structures 130 may comprise a gate insulation layer 131, which may comprise a high-k dielectric material, for instance in the form of hafnium oxide, hafnium silicon oxide, zirconium oxide and the like. As illustrated, the gate dielectric material 131 may also be formed on sidewalls of the gate electrode structure 130, while, in other cases, the gate dielectric material may only be formed at the bottom of the gate opening 130O. Moreover, in the example shown, a metal-containing material layer 132, for instance in the form of lanthanum, aluminum and the like, may be provided and may have incorporated therein an appropriate metal species so as to adjust the work function of the gate electrode structure 130. Finally, a highly conductive electrode metal 133, such as aluminum, an aluminum alloy, for instance aluminum titanium, and the like, may be provided so as to act as a low ohmic electrode material.

The semiconductor device 100 as illustrated in FIG. 1a may be formed on the basis of the following process strategy. Appropriate active regions (not shown) may be formed in the semiconductor layer 102 by providing appropriate isolation structures (not shown) in order to laterally delineate the active regions. Thereafter, the gate electrode structures 130 may be formed by providing an appropriate stack of material layers, such as a silicon dioxide layer, a polysilicon layer in combination with further materials, such as a dielectric cap material, hard mask materials and the like, as may be required for the further processing of the device 100. Next, sophisticated lithography and etch techniques may be applied in order to pattern the gate electrode structures 130 similar to conventional process strategies using silicon dioxide/polysilicon gate electrode structures without any sophisticated high-k materials. In other approaches, the high-k dielectric material in combination with a conductive cap material may be provided in this early manufacturing stage together with a silicon material. After the patterning of the gate electrode structures, for instance with a critical length of 40 nm and less, the further processing is continued on the basis of any appropriate process flow for forming the drain and source regions 153 in combination with the sidewall spacer structure 151. After any high temperature processes for activating the dopants and adjusting the final dopant profile of the drain and source regions 153, the metal silicide 154 may be formed on the basis of any appropriate silicidation technique. Next, the material 120 may be formed, for instance by depositing the layers 121, 122, which may include the deposition of highly stressed dielectric materials for further enhancing performance of one or both of the transistors 150A, 150B and the like. Thereafter, the material 120 may be planarized so as to finally expose the polysilicon material in the gate electrode structures 130, which may then be removed on the basis of highly selective etch chemistries, thereby forming the gate openings 130O. It should be appreciated that also any dielectric material provided at the bottom of the gate opening 130O may be removed, at least partially, if considered appropriate, and thereafter the high-k dielectric material 131 may be deposited. In other cases, a high-k dielectric material may have been provided in an early manufacturing stage. If required, the material layer 132 is deposited by any appropriate deposition technique, followed by the deposition of the electrode metal 133, which may be accomplished by sputter deposition, electrochemical deposition and the like. In order to reliably fill the gate openings 130O, a certain degree of overfill is typically required, as is shown in dashed lines in FIG. 1a. Next, any excess material of the layer 133 and possibly of the layer 132 is removed on the basis of a chemical mechanical polishing process 103, in which preferably the material of the layer 133 is removed. As discussed above, typically, an appropriate slurry material, i.e., a solution including an appropriate chemically active component, is applied, while abrasives may also be provided in order to provide a significant physical component in removing the materials 133 and 132. For example, when removing aluminum material or aluminum alloys, typically alumina, i.e., aluminum oxide, may be used as an appropriate material for the abrasive particles, which, however, tend to agglomerate, in particular at a final phase of the removal process 103, when typically two different metal species, such as the material of the layer 133 and the metal component of the layer 132, are to be polished. Consequently, in addition to any micro scratches, which may be caused by the alumina particles in the dielectric material 120, i.e., after removing the very thin dielectric material 131, if provided at all, the increasing agglomeration of the alumina particles may cause pronounced cracks in the material 122, as indicated by 124. Since a corresponding over-polish time may have to be applied in order to reliably remove any metal residues, a significant number of cracks 124 may be generated during the removal process 103.

After the removal process 103, the gate electrode structures 130 are laterally embedded by the interlayer dielectric material 120, while, on the other hand, the highly conductive gate electrode structures 130 have exposed metal surface areas, thereby allowing contact by any metal regions of a metallization system. On the other hand, the contact areas 154 in the drain and source regions 153 may require contact elements extending through the interlayer dielectric material 120, wherein, however, contrary to many other conventional approaches, these contact elements may be formed through a moderately thin dielectric material, thereby avoiding undue aspect ratio and thus allowing the patterning of contact openings with reduced lateral dimensions.

FIG. 1b schematically illustrates the semiconductor device 100 in a further advanced manufacturing stage. An etch mask 104, such as a resist mask and the like, is formed on the interlayer dielectric material 120 and is appropriately configured so as to define the lateral size and position of contact openings 123 to be formed in the material 120. Since the height of the contact openings 123 is substantially restricted to the height of the gate electrode structures 130, desired reduced lateral dimensions may be achieved, thereby enabling providing the semiconductor device 100 with an increased packing density. That is, the lateral offset of the transistors 150A, 150B may be selected so as to comply with the patterning capability for forming the contact opening 123 through the layer 120 having a height that substantially corresponds to the height of the gate electrode structures 130. The etch mask 104 may be provided on the basis of any appropriate lithography technique. Thereafter, an appropriate etch sequence is applied so as to etch through the materials 122 and 121 in order to finally expose the metal silicide in the contact areas 154. Thereafter, the etch mask 104 is removed and, if required, appropriate cleaning processes may be applied.

FIG. 1c schematically illustrates a top view of the semiconductor device 100 after the above-described process sequence. As illustrated, a plurality of the gate electrode structures 130 is provided and the contact openings 123 are appropriately positioned so as to provide the required electrical contact to the transistors 150A, 150B, as shown in FIGS. 1a and 1b. Furthermore, as shown, the cracks 124 may be present in a more or less pronounced degree, wherein some of the cracks 124 may extend between two contact openings 123, as is illustrated at the left hand side in FIG. 1c.

FIG. 1d schematically illustrates the device 100, again in a cross-sectional view, in a further advanced manufacturing stage. As illustrated, a contact material 126, possibly in combination with a conductive barrier material 127, is formed above the dielectric material 120 and within the contact openings 123. For example, the contact material 126 may be comprised of tungsten, while the conductive barrier material 127 may comprise titanium, titanium nitride and the like. The materials 126, 127 may be provided on the basis of any appropriate deposition technique, such as chemical vapor deposition (CVD) and the like.

FIG. 1e schematically illustrates the device 100 during a further removal process 105 that comprises a chemical mechanical polishing process. During the process 105, any excess material of the layers 126 and 127, if provided, (FIG. 1*d*) are removed as discussed above. Typically, a specific slurry material may have to be selected so as to provide a desired degree of selectivity during the polishing process 105. During a final phase of the process 105, however, at least two different metals may be present, i.e., the electrode metal 133, such as aluminum, an aluminum alloy and the like, and the contact material 126, for instance in the form of tungsten. Consequently, due to different electrochemical behavior of the metals 133, 126, these materials may respond differently to the slurry used, which may result in a different degree of material removal in the final phase of the process 105. In some cases, metal agglomeration may be observed in one type of metal, while a pronounced metal depletion may be observed for the other type of metal during the final polishing phase. Furthermore, since a certain over-polish time may have to be applied in order to provide electrically insulated contact elements 125, a corresponding difference in response to the applied slurry material may thus result in metal depletion, for instance in the contact elements 125. On the other hand, the previously generated cracks 124 may still remain filled with the contact material, thereby providing efficient leakage paths.

FIG. 1*f* schematically illustrates the semiconductor device 100 after the polishing process 105 shown in FIG. 1*e*. As illustrated, some of the contact elements 125 may include irregularities, such as depleted zones 125A, which may result in a significantly increased contact resistivity. On the other hand, metal-filled cracks, such as the crack 124 on the left hand side of FIG. 1*f*, may connect two of the contact elements 125 thereby short-circuiting these contacts 125, which may even result in a total failure of the device 100.

Consequently, in a contact regime using the dielectric material 120 for forming contact elements of reduced height, the conventional strategy described above may provide significant defectivity and device failures, which may thus contribute to a reduced production yield. In some conventional approaches, superior slurry materials may be used during the removal process 105 of FIG. 1*e* which, however, may require significant research and development efforts for obtaining an appropriate chemical solution, while nevertheless a desired balance between the chemical response of two different metal materials may nevertheless be very difficult to achieve. Moreover, the metal-filled cracks may nevertheless contribute to significant contact failures.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which contact elements may be formed in the presence of sophisticated high-k metal gate electrode structures, wherein any defects caused by metal removal processes may be reduced by masking the metal gate electrodes without unduly increasing the aspect ratio of the contact openings to be formed in the interlayer dielectric material. At the same time, the mask material may reliably fill any cracks that may have been created during an earlier manufacturing sequence, thereby reducing the risk of creating additional leakage paths, while nevertheless applying well-established polishing-based removal processes during the replacement gate approach. In some illustrative aspects disclosed herein, the mask material may be simultaneously used as a hard mask for etching the contact openings, thereby contributing to a very efficient overall process flow without increasing the aspect ratio of the resulting contact openings.

One illustrative method disclosed herein comprises forming a dielectric cap layer above a gate electrode structure of a transistor that is formed above a semiconductor region. The gate electrode structure is laterally embedded in an interlayer dielectric material and comprises a high-k dielectric material and an electrode metal. The method further comprises forming a contact opening laterally offset from the gate electrode structure so as to extend through the dielectric cap layer and the interlayer dielectric material. The method further comprises forming a contact material in the contact opening and removing an excess portion of the contact material so as to expose the dielectric cap layer. Additionally, the method comprises performing a removal process so as to expose the electrode metal of the gate electrode structure.

A further illustrative method disclosed herein comprises forming an electrode metal in an opening of a gate electrode structure of a transistor, wherein the gate electrode structure is laterally embedded in a dielectric material. The method further comprises removing an excess portion of the electrode metal by performing a first removal process. Furthermore, the method comprises forming a dielectric cap layer above the electrode metal and the dielectric material. Additionally, the method comprises forming a contact opening in the dielectric cap layer and the dielectric material without exposing the electrode metal, wherein the contact opening connects to one of a drain region and a source region. Moreover, the method comprises forming a contact metal in the contact opening and above the dielectric layer. The method further comprises removing an excess portion of the contact metal by performing a second removal process.

A still further illustrative method disclosed herein comprises forming a dielectric etch mask above a dielectric material and an electrode metal of a gate electrode structure that is laterally embedded in the dielectric material. The etch mask covers the electrode metal and comprises a mask opening so as to define a lateral position and size of a contact opening. The method additionally comprises forming the contact opening in the dielectric material by using the etch mask. Furthermore, the method comprises filling the contact opening with a conductive material in the presence of the etch mask and removing the etch mask at least from the electrode metal.

BRIEF DESCRIPTION OF THE DRAWINGS

The disclosure may be understood by reference to the following description taken in conjunction with the accompanying drawings, in which like reference numerals identify like elements, and in which.

Figure 1A:
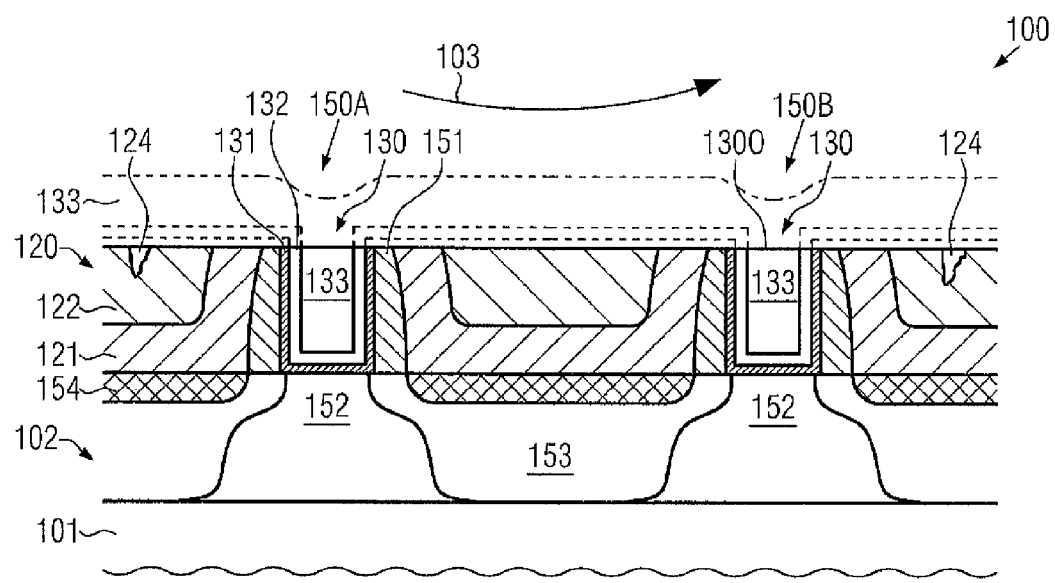
FIGS. 1*a*-1*b* schematically illustrate cross-sectional views of a semiconductor device when forming a contact opening in a dielectric material having a height comparable to the height of a high-k metal gate electrode structure, according to a conventional strategy.
Figure 1B:
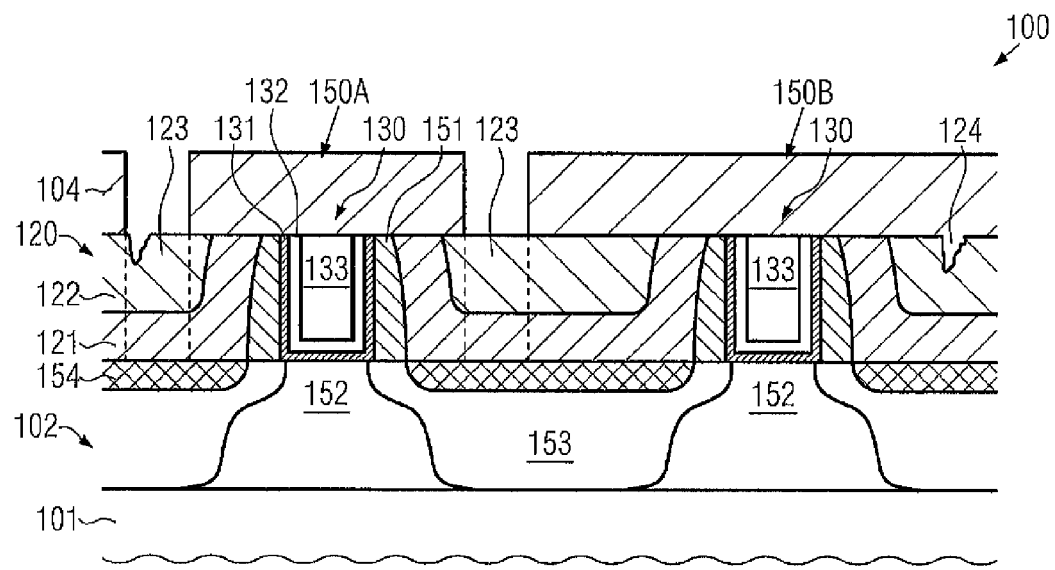
Figure 1C:
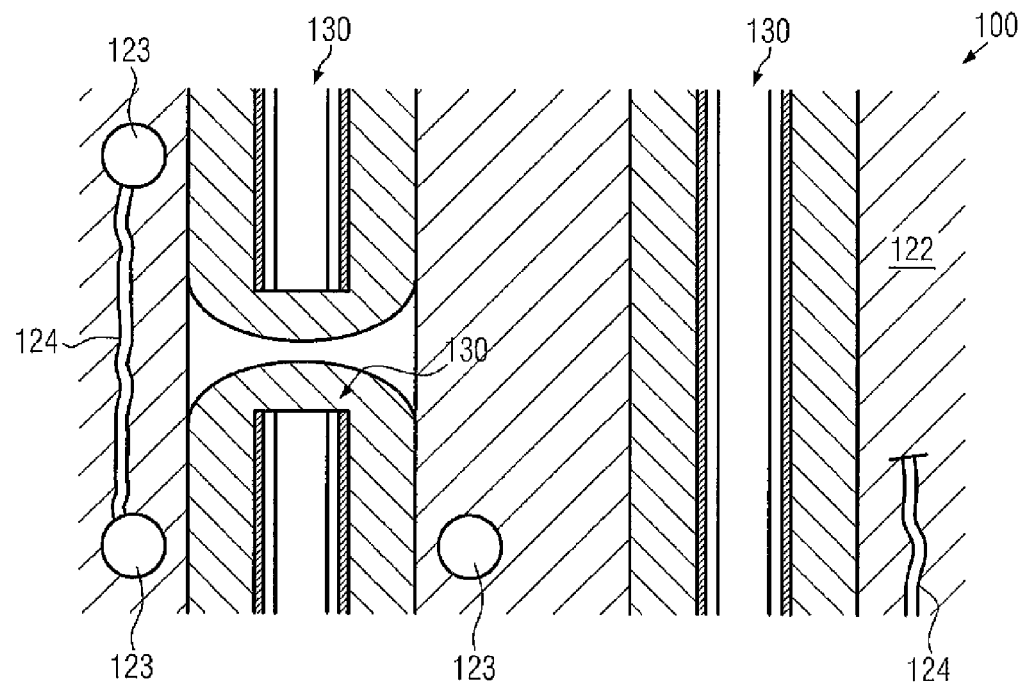
FIG. 1*c* schematically illustrates a top view of the semiconductor device after the etch process for forming contact openings.
Figure 1D:
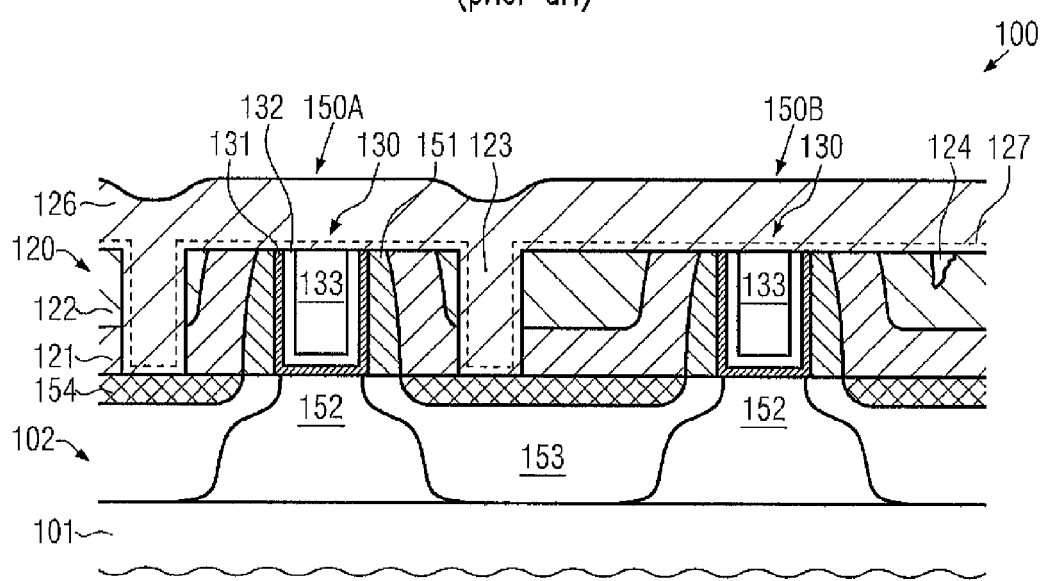
FIGS. 1*d*-1*e* schematically illustrate cross-sectional views of the semiconductor device in further advanced manufacturing stages in which the removal of excess material of the contact metal may result in a high defect rate, according to conventional strategies.
Figure 1E:
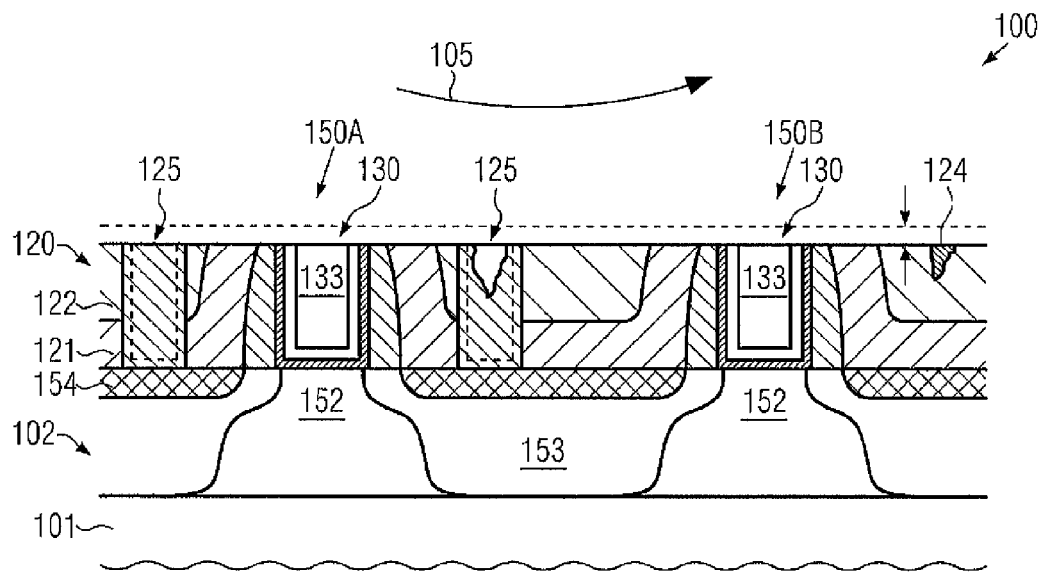
Figure 1F:
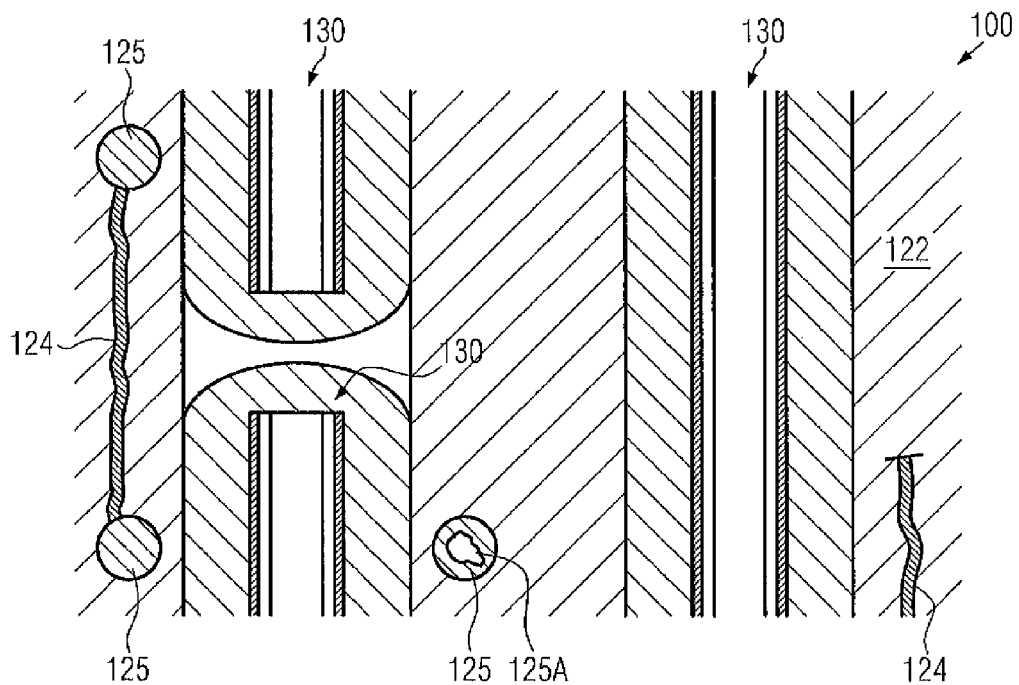
FIG. 1*f* schematically illustrates a top view of the semiconductor device with defective contact elements and leakage paths according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing strategies in which contact elements may be formed on the basis of a device geometry which is substantially determined by the height of the gate electrode structures, wherein the overall defect rate may be reduced while enabling the removal of excess material of the contact metal on the basis of well-established removal processes, such as CMP, using available slurry materials. To this end, the semiconductor device may receive a moderately thin dielectric material layer, which may be understood as a material layer having a thickness that is adapted to a depth of any cracks created during the earlier manufacturing phases in order to reliably seal any such cracks and also cover the electrode metal of the high-k metal gate electrode structures. For example, the dielectric cap layer, which in some illustrative embodiments may also be used as a hard mask, may have a thickness of approximately 20 nm to several hundred nanometers. Consequently, the further processing, i.e., the formation of the contact openings and the filling thereof with an appropriate conductive material, may be continued without unduly increasing the overall aspect ratio of the contact opening, while, at the same time, failure mechanisms, such as cracks and a different response to a removal process of different types of conductive materials in a final phase of the removal process, may be avoided or at least significantly reduced. Consequently, the contact openings and thus the contact elements may be provided with reduced critical dimensions and may be applied in the context of sophisticated semiconductor devices including circuit elements having critical dimensions of 40 nm and less, such as 30 nm and the like.

With reference to FIGS. 2*a*-2*f*, further illustrative embodiments will now be described in more detail, wherein reference may also be made to FIGS. 1*a*-1*f*, if appropriate. It should be appreciated that, in particular, it may be referred to FIG. 1*a* in view of manufacturing techniques and characteristics and features of sophisticated transistors including high-k metal gate electrode structures.

Figure 2A:
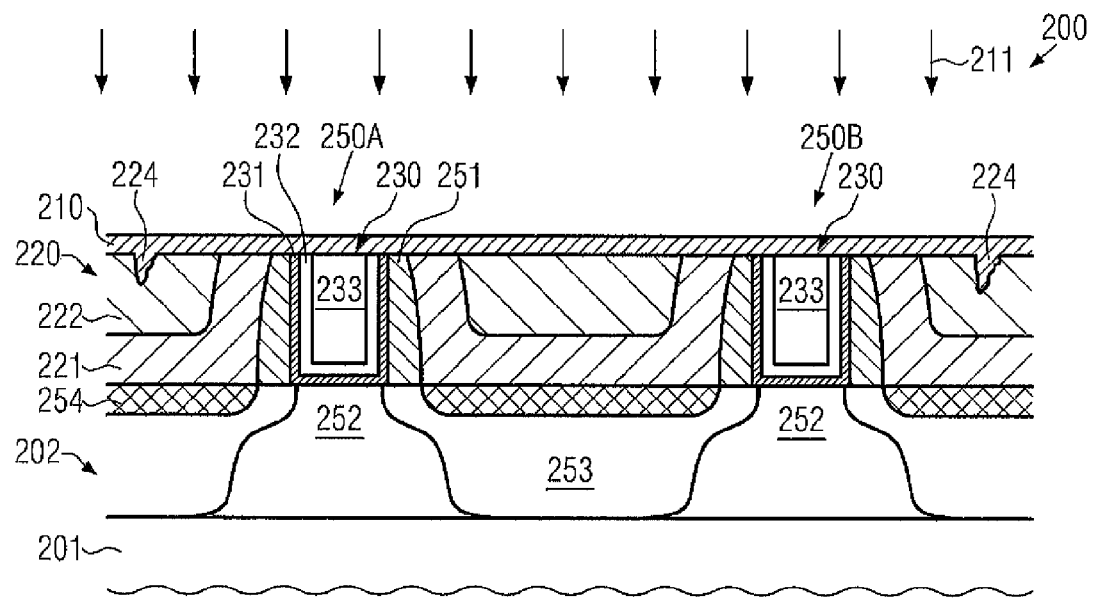
FIG. 2*a* schematically illustrates a cross-sectional view of a semiconductor device comprising high-k metal gate electrode structures formed on the basis of a replacement gate approach with a dielectric cap layer or a mask layer that covers the electrode metal of the gate electrode structures, according to illustrative embodiments.

FIG. 2*a* schematically illustrates a cross-sectional view of a semiconductor device 200 comprising a substrate 201, a semiconductor layer 202, in and above which transistor elements 250A, 250B may be provided. The transistors 250A, 250B may comprise gate electrode structures 230, drain and source regions 253, channel regions 252 and contact regions 254. The gate electrode structures 230, in this manufacturing stage, may represent high-k metal gate electrode structures, which may comprise a high-k dielectric material 231 and an electrode metal 233, possibly in combination with a work function metal 232 or any other type of conductive barrier or etch stop material, such as titanium nitride, tantalum nitride and the like. The transistors 250A, 250B may represent sophisticated planar transistor devices in which critical dimensions, i.e., a length of the gate electrode structures 230, may be 40 nm and less. It should be appreciated that, in view of any characteristics of the components described so far, the same criteria may apply as previously discussed with reference to the semiconductor device 100 when describing similar components with reference to FIG. 1*a*.

Similarly, the semiconductor device 200 may comprise an interlayer dielectric material 220 in which the gate electrode structures 230 are laterally embedded, as is also previously discussed with reference to the semiconductor device 100. For example, the dielectric material 220 may comprise two or more individual material layers, such as the material 221, for instance comprised of silicon nitride, and a material layer 222, such as a silicon dioxide layer and the like. As illustrated, the dielectric material 220 may have substantially the same height as the gate electrode structures 230. Moreover, a dielectric cap layer or a mask layer 210 may be formed above the dielectric material 220 and the gate electrode structures 230. The mask layer 210 may be comprised of any appropriate dielectric material, such as silicon nitride, silicon oxynitride, silicon dioxide and the like. In other cases, other materials, such as polymer materials and the like, may be used as long as these materials may withstand the process conditions of subsequent processes, such as a deposition process and a subsequent material removal process. In still other illustrative embodiments, the material 210 may comprise two or more material layers that may be used as a hard mask material during the further processing. For example, amorphous carbon, silicon oxynitride and the like may be used in this case.

The semiconductor device 200 may be formed on the basis of any appropriate manufacturing technique for providing the transistors 250A, 250B and the dielectric material 220. For example, the same process techniques and materials may be used as previously described with reference to the semiconductor device 100. Thus, in some illustrative embodiments, after the deposition of the dielectric material 220, a replacement gate approach may be applied and any placeholder materials may be replaced by at least the electrode metal 233, possibly in combination with an additional metal material 232 and the high-k dielectric layer 231. Thereafter, any excess portion of the material 233, and possibly of the material 232, may be removed by any appropriate removal process, such as the process 103 as described with reference to FIG. 1a. Thus, any appropriate process recipe may be applied which, however, may result in the creation of certain surface irregularities, such as cracks 224, within the dielectric material 220, as is also previously discussed. Contrary to conventional strategies, however, the presence of the cracks 224 may not negatively affect the further processing. To this end, a deposition process 211 may be applied in order to form the dielectric cap layer or mask layer 210, for instance by CVD techniques, spin-on techniques and the like. As previously explained, the layer 210 may be provided with a thickness of approximately 20 nm to several hundred nanometers, depending on the surface topography in the layer 220 after the preceding removal process. That is, the thickness of the layer 210 is typically selected to be greater than an expected maximum depth of the cracks 224, thereby ensuring a reliable filling of the cracks 224 with a dielectric material. Depending on the deposition technique used, a polishing process may be applied so as to provide a superior surface topography of the layer 210.

Figure 2B:
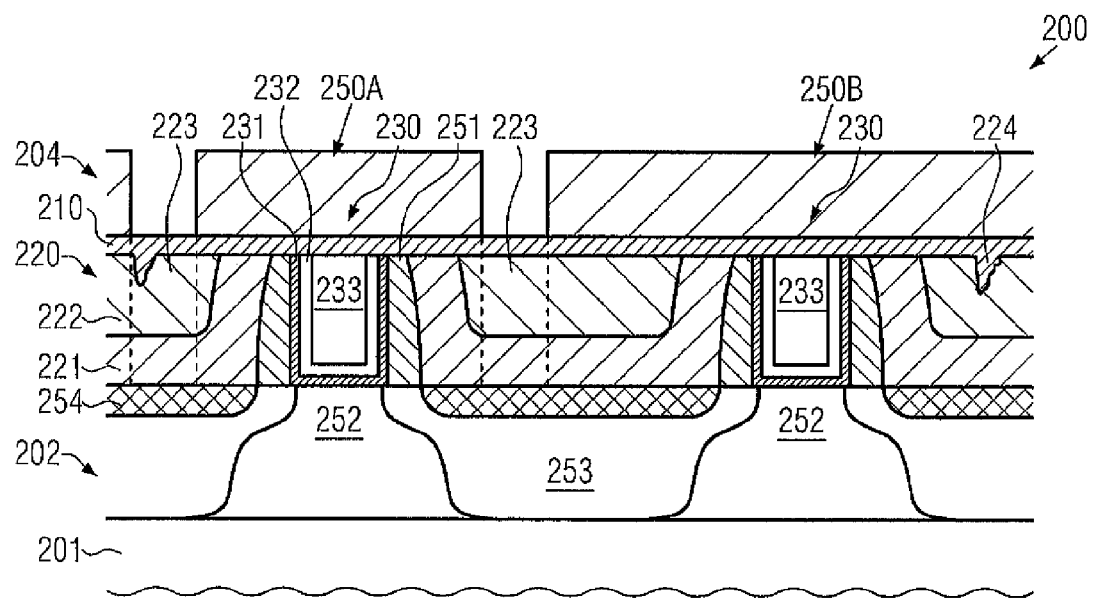
FIG. 2*b* schematically illustrates the device with an etch mask for commonly patterning the dielectric cap layer and the interlayer dielectric material, according to illustrative embodiments.

FIG. 2b schematically illustrates the semiconductor device 200 in a further advanced manufacturing stage. As illustrated, an etch mask 204 may be provided, for instance in the form of a resist material, in order to determine the lateral size and position of contact openings 223 to be formed in the dielectric material 220 and the dielectric cap layer 210. To this end, any appropriate lithography technique may be applied. Thereafter, any appropriate etch process may be used so as to etch through the layer 210 and through the layers 220, thereby finally exposing a portion of the contact regions 254. To this end, any appropriate process recipe may be applied. For example, the dielectric cap layer 210 may have a similar etch behavior compared to the material 222, thereby enabling the usage of well-established etch recipes. In other cases, an appropriate etch chemistry may be applied to etch through the layer 210 and subsequently well-established etch parameters may be used for etching through the dielectric material 220.

Figure 2C:
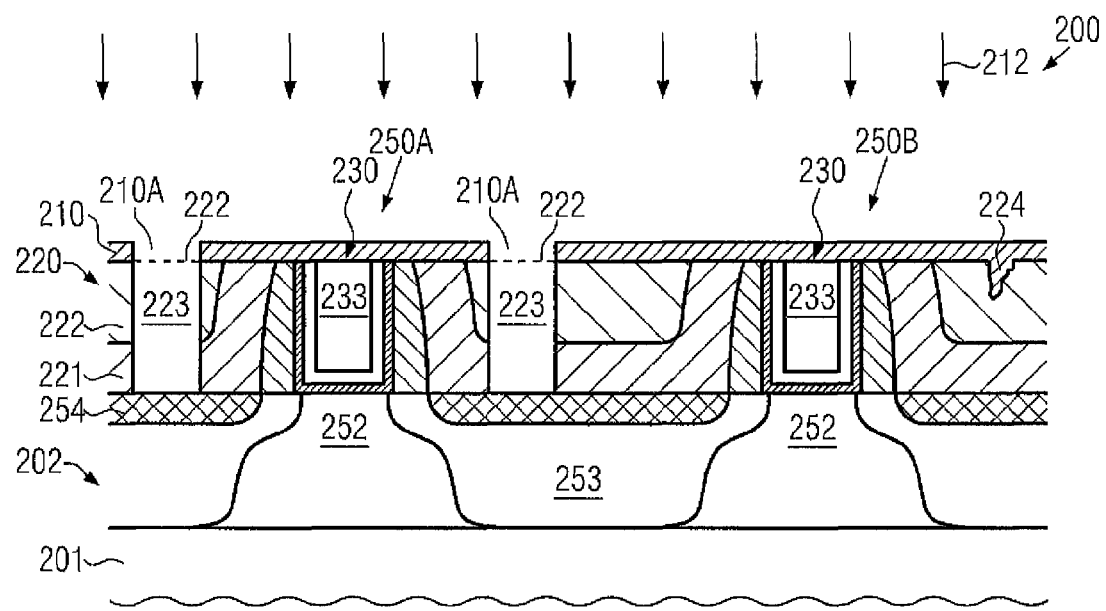
FIG. 2*c* schematically illustrates the semiconductor device with the patterned mask layer which may act as a hard mask for forming the contact openings, while at the same time reliably filling any cracks and covering the electrode metal, according to still further illustrative embodiments.

FIG. 2c schematically illustrates the semiconductor device 200 according to still further illustrative embodiments in which the layer 210 may be used as an etch mask. That is, the dielectric material of the layer 210 may be patterned so as to receive respective mask openings 210A, which may correspond to the contact openings 223. To this end, a resist mask may be used for patterning the layer 210, which may then be used as the actual etch mask after the removal of the resist material. For example, the layer 210 may be comprised of amorphous carbon, possibly in combination with silicon oxynitride and the like, so that a reduced thickness of the layer 210 may provide sufficient etch resistivity in order to reliably form the contact openings 223 with the desired lateral dimensions. On the other hand, the electrode metal 233 may be reliably covered by the layer 210 and also the cracks 224 may be sealed, except for any crack portions which may be within an area corresponding to the contact openings 223. That is, any cracked portion positioned within the openings 210A may be reliably exposed upon patterning the layer 210. In other cases, the etch mask 210 may be provided in the form of a polymer material, which may be applied in a highly non-conformal manner and which may be treated so as to withstand process conditions during the subsequent deposition of the contact material.

After forming the contact openings 223, one or more conductive materials may be deposited on the basis of any appropriate deposition technique, such as CVD, electrochemical deposition, sputter deposition, or any combination thereof, while the layer 210 may be present and may thus reliably seal the cracks 224 and cover the electrode metal 233. In some illustrative embodiments, the contact material to be deposited in the openings 223 may have a different material composition compared to the electrode metal 233, thereby providing a high degree of flexibility in selecting an appropriate material for the gate electrode structures 230, on the one hand, and for the contact elements to be formed in the openings 223, on the other hand. In other cases, similar or the same material may be used for the contact elements as may also be used as the electrode metal 233.

Figure 2D:
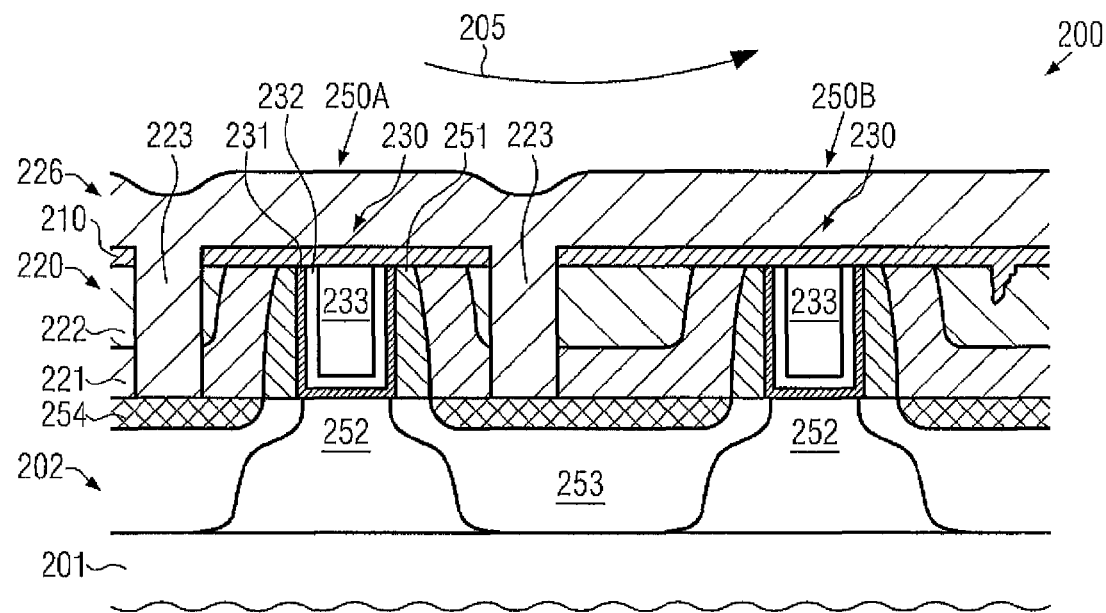
FIGS. 2*d*-2*g* schematically illustrate cross-sectional views of the semiconductor device during advanced manufacturing stages of removing any excess material of the contact material and removing at least a significant portion of the dielectric cap material or etch mask, according to still further illustrative embodiments.

FIG. 2d schematically illustrates the semiconductor device 200 with a contact material 226, such as tungsten, aluminum, aluminum alloys and the like, formed in the contact openings 223 and above the dielectric cap layer 210. It should be appreciated that, if required, one or more additional material layers, such as conductive barrier materials and the like, may be provided, as is also previously discussed with reference to the semiconductor device 100. Furthermore, the device 200 may be subjected to a material removal process 205, which, in some illustrative embodiments, comprises a chemical mechanical process, wherein a slurry material is appropriately selected so as to allow an efficient removal of an excess portion of the layer 226. Due to the provision of the dielectric cap layer 210, well-established slurry materials may be applied since the layer 210 may act as a stop layer or may at least avoid a direct contact of the materials 226 and 233 in a final stage of the removal process 205. Consequently, well-established material systems and CMP recipes may be applied during the removal of excess portions of the layer 226.

Figure 2E:
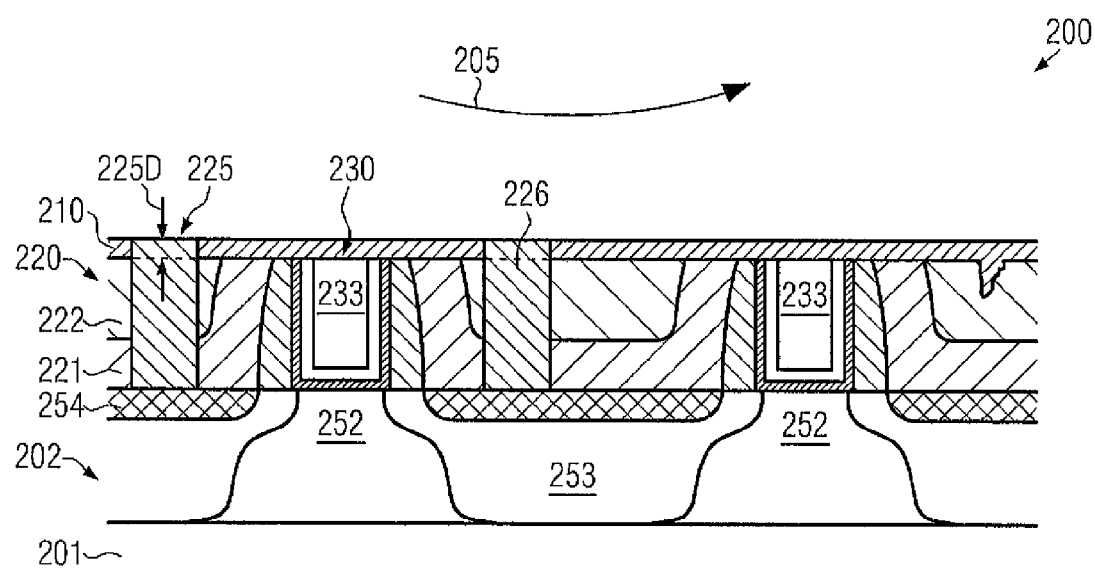

FIG. 2e schematically illustrates the semiconductor device 200 in a final phase of the removal process 205, wherein undesired residues of the conductive material 226 may be removed from the layer 210, thereby forming electrically insulated contact elements 225. Thus, undue interaction of the ambient of the process 205 with the electrode metal 233 may be avoided due to the presence of the material layer 210. In some illustrative embodiments, the process 205 may be performed with an appropriate over-polish time so as to create a certain degree of dishing 225D while the electrode metal 233 may still be reliably covered by the layer 210. In this manner, a similar height level of the metal 226 in the contact elements 225 may be achieved in the gate electrode structures 230 for the electrode metal 233. In other cases, a pronounced degree of dishing may be avoided, for instance when the material 210 and the metal 226 may have a similar removal rate during the process 205.

Figure 2F:
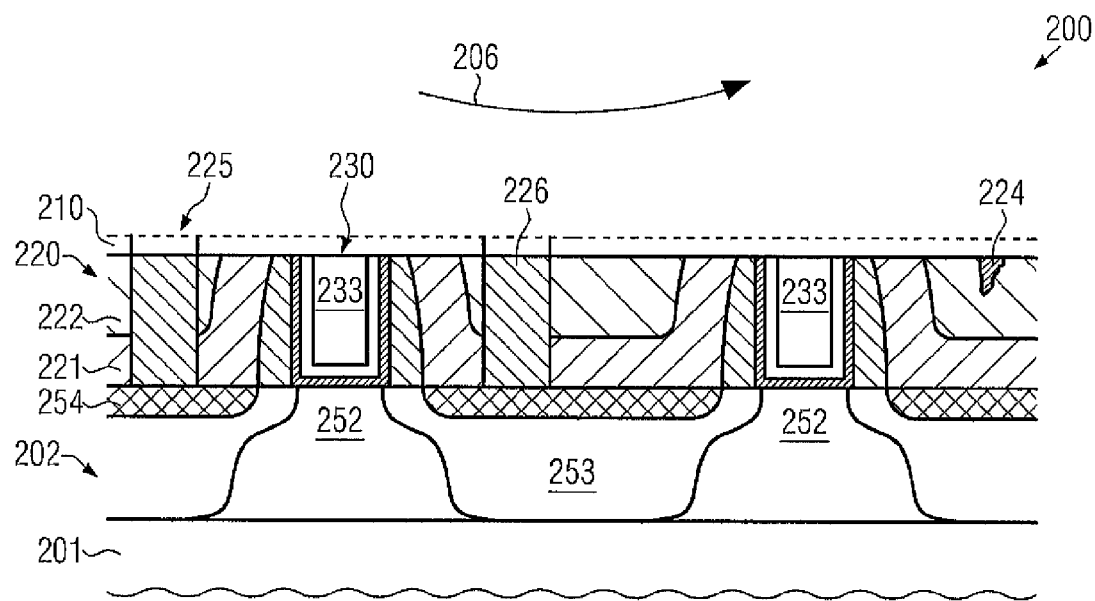

FIG. 2f schematically illustrates the device 200 during a further advanced stage in which the dielectric cap layer 210 may be removed in order to expose the electrode metal 233 of the gate electrode structures 230. To this end, in some illustrative embodiments, the removal process 206 may be performed as a polishing process on the basis of any appropriate slurry material with "mild" process parameters, for instance in terms of downforce and the like, thereby efficiently removing the material 210 while not unduly damaging the metals in the gate electrode structure 230 and the contact elements 225. It should be appreciated that, during the process 206, process parameters are selected such that the material 210 may be removed by allowing any process recipes for removing dielectric materials which may not unduly interact with any metal materials. Furthermore, the situation during the process 206 is quite different compared to the removal process 105 described in FIG. 1e, since, in the conventional strategy, a substantially continuous metal layer has to be reliably removed from dielectric surface portions, wherein the slurry used may significantly react with any metal material, however in a typically different manner. Moreover, a pronounced overpolish time may be required since any metal residue may result in undue leakage paths. On the other hand, in FIG. 2f, although finally the electrode metal 233 may be exposed, the process conditions are selected to remove the dielectric material of the layer 210, substantially without attacking the metal materials in the components 225 and 230. On the other hand, any dielectric residues, for instance in the gate electrode structures 230, may be efficiently removed on the basis of a subsequent cleaning process, if required.

In other illustrative embodiments, the removal process 206 may represent an over-polish time of the process 205 as shown in FIG. 2e, where increasingly the layer 210 may be removed while at the same time also reducing the height of the contact elements 225, while the electrode metal 233 may be exposed in a very advanced phase in which any excess material of the contact elements 225 has already been removed. Consequently, also in this case, superior process conditions may be achieved.

Figure 2G:
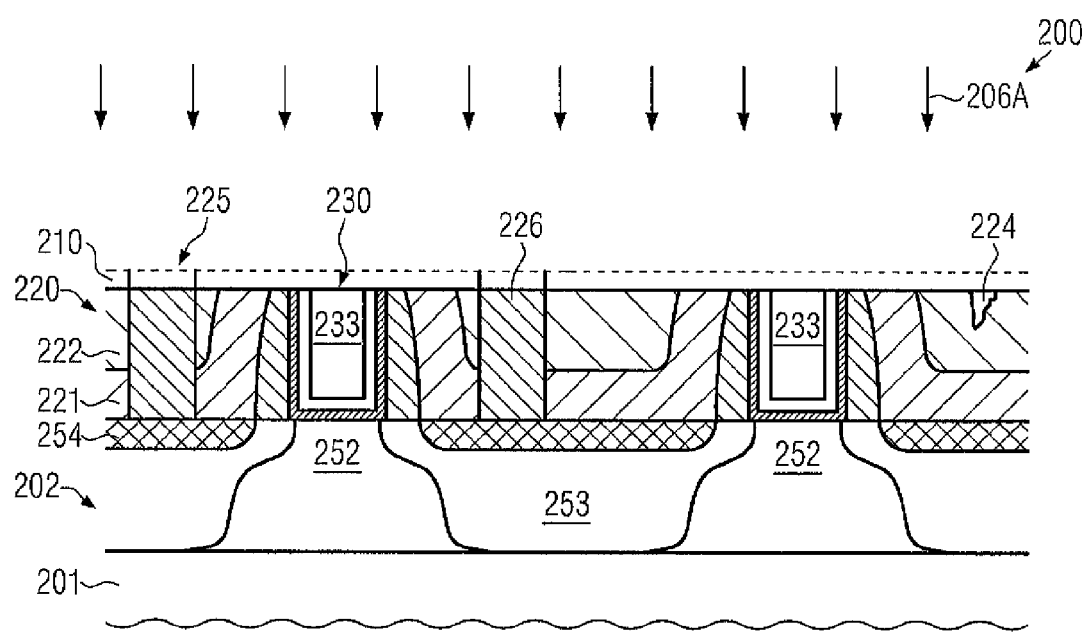

FIG. 2g schematically illustrates the semiconductor device 200 during a material removal process 206A, which may comprise a selective etch step so as to remove the layer 210. In this case, the layer 210 may be provided with any appropriate material composition so as to allow a selective removal with respect to the material 220 and also to the conductive materials of the components 225 and 230. For example, efficient wet chemical etch recipes may be applied, for instance for removing polymer materials and the like. On the other hand, any such etch chemistries may have a significantly reduced etch rate with respect to a plurality of metal materials, thereby not unduly reducing the height of the contact elements 225 and the electrode metal 233. As previously explained, an appropriate height of the contact elements 225 may have been provided on the basis of a certain degree of dishing, when any extra height corresponding to the thickness of the layer 210 is considered inappropriate for the contact elements 225, when the layer 210 is to be removed on the basis of the etch process 206A.

In other cases, the process 206A may comprise plasma assisted etch recipes if considered appropriate. It should be appreciated that, during the etch process 206A, the cracks 224 may also be exposed, which, however, may not negatively affect the further processing since, in this case, typically, a further dielectric material may be provided, for instance for forming a metallization layer above the dielectric material 220.

As a result, the present disclosure provides manufacturing techniques in which the defect rate caused by cracks and/or material depletion in contact elements may be reduced or completely avoided by appropriately covering the electrode metal of sophisticated high-k metal gate electrode structures upon patterning the interlayer dielectric material and re-filling the contact openings with an appropriate conductive material. Consequently, any cracks may be reliably filled with dielectric material prior to the deposition of the contact material and the subsequent removal of any excess portion of the contact material may not result in undue interaction with the electrode metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dielectric cap layer above a gate electrode structure to fill at least one void in an interlayer dielectric material of a transistor formed above a semiconductor region, said gate electrode structure being laterally embedded in the interlayer dielectric material and comprising a high-k dielectric material and an electrode metal;
    forming a contact opening laterally offset from said gate electrode structure so as to extend through said dielectric cap layer and said interlayer dielectric material;
    forming a contact material in said contact opening;
    removing an excess portion of said contact material so as to expose said dielectric cap layer; and
    performing a removal process to remove a first portion of the dielectric cap layer so as to expose said electrode metal of said gate electrode structure and leave a second portion of the dielectric cap layer in said at least one void.

2. The method of claim 1, wherein removing an excess portion of said contact material comprises performing a chemical mechanical polishing process.

3. The method of claim 1, wherein performing said removal process comprises performing a polishing process.

4. The method of claim 1, wherein performing said removal process comprises performing an etch process.

5. The method of claim 1, further comprising forming said gate electrode structure by providing said gate electrode structure so as to comprise a placeholder material, removing said placeholder material, forming at least said electrode metal and removing an excess portion of said electrode metal by performing a chemical mechanical polishing process.

6. The method of claim 1, wherein forming said contact opening comprises patterning said dielectric cap layer and using said patterned dielectric cap layer as an etch mask.

7. The method of claim 1, wherein said electrode metal and said contact material have different material compositions.

8. The method of claim 1, wherein removing an excess portion of said contact material and exposing said electrode metal comprises performing a single chemical mechanical polishing process.

9. The method of claim 1, wherein a lateral distance between said electrode metal and said contact material is 40 nm or less after performing said removal process.

10. A method, comprising:
  forming an electrode metal in an opening of a gate electrode structure of a transistor, said gate electrode structure being laterally embedded in a dielectric material;
  removing an excess portion of said electrode metal by performing a first removal process;
  forming a dielectric cap layer above said electrode metal and said dielectric material to fill at least one void in said dielectric material;
  forming a contact opening in said dielectric cap layer and said dielectric material without exposing said electrode metal, said contact opening connecting to one of a drain region and a source region;
  forming a contact metal in said contact opening and above said dielectric cap layer;
  removing an excess portion of said contact metal by performing a second removal process; and
  exposing said electrode metal by removing a first portion of the dielectric cap layer, wherein a second portion of the dielectric cap layer remains in said at least one void.

11. The method of claim 10, wherein performing said first removal process comprises performing a first chemical mechanical polishing process.

12. The method of claim 11, wherein performing said second removal process comprises performing a second chemical mechanical polishing process.

13. The method of claim 10, wherein exposing said electrode metal comprises exposing said electrode metal after performing said second removal process.

14. The method of claim 13, wherein exposing said electrode metal comprises performing a polishing process.

15. The method of claim 13, wherein exposing said electrode metal comprises performing an etch process.

16. The method of claim 10, wherein forming said contact opening comprises forming a mask opening in said dielectric cap layer and using said mask opening as an etch mask.

17. The method of claim 10, wherein a lateral offset of said contact opening from said electrode metal is 40 nm or less.

18. A method, comprising:
  forming a dielectric cap layer above a gate electrode structure to fill at least one void in an interlayer dielectric material of a transistor formed above a semiconductor region, said gate electrode structure being laterally embedded in the interlayer dielectric material and comprising a high-k dielectric material and an electrode metal; and
  performing a removal process to remove a first portion of the dielectric cap layer so as to expose said electrode metal of said gate electrode structure and leave a second portion of the dielectric cap layer in said at least one void.

19. The method of claim 18, comprising forming a contact opening laterally offset from said gate electrode structure so as to extend through said dielectric cap layer and said interlayer dielectric material and forming a contact material in said contact opening.

20. The method of claim 19, comprising removing an excess portion of said contact material so as to expose said dielectric cap layer.

* * * * *